(12) United States Patent
Zeng

(10) Patent No.: US 7,554,131 B2
(45) Date of Patent: Jun. 30, 2009

(54) CHIP EMBEDDED PACKAGE STRUCTURE AND FABRICATION METHOD THEREOF

(75) Inventor: Zhao-Chong Zeng, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 118 days.

(21) Appl. No.: 11/391,058

(22) Filed: Mar. 28, 2006

(65) Prior Publication Data
US 2006/0220222 A1   Oct. 5, 2006

(30) Foreign Application Priority Data
Mar. 29, 2005   (TW) ............................. 94109709 A

(51) Int. Cl.
*H01L 21/50* (2006.01)
*H01L 21/48* (2006.01)
*H01L 21/44* (2006.01)

(52) U.S. Cl. ................. 257/125; 257/126; 257/106; 257/127

(58) Field of Classification Search ............. 257/106, 257/125, 126, 127
See application file for complete search history.

(56) References Cited

U.S. PATENT DOCUMENTS

| | | | | |
|---|---|---|---|---|
| 5,474,958 A | * | 12/1995 | Djennas et al. | 29/827 |
| 5,583,377 A | * | 12/1996 | Higgins, III | 257/707 |
| 6,518,885 B1 | * | 2/2003 | Brady et al. | 340/572.7 |
| 6,664,617 B2 | * | 12/2003 | Siu | 257/669 |
| 6,900,535 B2 | * | 5/2005 | Zhou | 257/707 |

* cited by examiner

*Primary Examiner*—Luan C Thai
(74) *Attorney, Agent, or Firm*—Sawyer Law Group, P.C.

(57) ABSTRACT

A chip embedded package structure and a fabrication method thereof are proposed. An adhesive layer is formed on a bottom surface of a carrier board having at least one cavity to seal one end of the cavity. At least one semiconductor chip is mounted via its non-active surface on the adhesive layer and received in the cavity. A protection layer is formed on an active surface of the semiconductor chip. A conductive layer is formed on a top surface of the carrier board, the protection layer and the cavity. A patterned resist layer is applied on the conductive layer and is formed with an electroplating opening at a position corresponding to a gap between the cavity and the semiconductor chip. An electroplating process is performed to form a metal layer in the electroplating opening, such that the semiconductor chip can be effectively fixed in the cavity by the metal layer.

8 Claims, 5 Drawing Sheets

CHIP EMBEDDED PACKAGE STRUCTURE AND FABRICATION METHOD THEREOF

CROSS-REFERENCE TO RELATED APPLICATIONS

This application claims benefit under 35 USC 119 of Taiwan Application No. 094109709, filed on Mar. 29, 2005.

FIELD OF THE INVENTION

The present invention relates to a method for fabricating a semiconductor package structure, and more particularly, to a method for fabricating a semiconductor chip to be effectively fixed in the carrier board.

BACKGROUND OF THE INVENTION

Due to rapid development of electronic industry, electronic products tend to be light, slim, short, small, integrative, and multi-functional. In order to satisfy the packaging requirement of integration and miniaturization of a semiconductor package, the package type of a semiconductor chip is gradually changed from a single chip type of ball grid array (BGA) or flip chip (FC) to 3D and modular package, therefore, different package structures are developed such as System in Package (SiP), System Integrated Package (SIP) and System in Board (SiB).

However, 3D and modular package provide flip chip (FC) or wire boding, which connect single semiconductor element one by one to a surface of the substrate, or adhere the elements to the surface by applying surface mounting technology (SMT). All the elements are distributed over a surface of a substrate, thus, no benefit is gained from modularization to enhance miniaturization and performance.

Therefore, a method of embedding a semiconductor element in a high density circuit board is proposed. FIG. 1 illustrates a conventional package structure of embedding a semiconductor element in the circuit board. Referring to a cross-sectional view, the package structure comprises a carrier board 10, and at least one cavity 100a is formed on a surface 100 of the carrier board 10; at least one semiconductor chip 11, and a plurality of electrode pads 110 is formed in the semiconductor chip 11, such pads are located on the carrier board 10 as well as embedded in the cavity 100a; a circuit build-up structure 12 is formed on the carrier board 10, and circuit build-up structure 12 is electrically connected to the electrode pads 110 in the semiconductor chip 11 by a plurality of conductive vias 120.

Although the forgoing problem can be solved, embedding a semiconductor chip in a circuit board exists several drawbacks due to the precision of a semiconductor chip integrated with a circuit board and errors of a router machine are uncontrollable while the semiconductor chip is embedded in the circuit board.

Firstly, when performing a build-up process on a semiconductor chip integrated with a circuit board, errors of a router machine and errors occurred in a subsequent fabrication process which limits the precision of electrode pads on the semiconductor chip should be considered. Therefore, after performing the build-up process, inaccurate alignment will be resulted, such that the build-up circuit cannot be effectively aligned to the electrode pad of the chip.

Furthermore, if a build-up process is directly performed without effectively stabilizing a semiconductor chip, the alignment of the semiconductor chip to the circuit board needs to be examined after the build-up process, so as to reduce efficiency, and increase an unknown problem as well as the product cost.

SUMMARY OF THE INVENTION

In view of the above drawbacks in the prior-art, a primary objective of the present invention is to provide a method for fabricating a chip embedded package structure which effectively positions a semiconductor chip in a carrier board by performing an electroplating process, so that the semiconductor chip can be integrated with the carrier board to benefit the subsequent fabrication process.

Another objective of the present invention is to provide a method for fabricating a chip embedded package structure which effectively positions a semiconductor chip in a carrier board by performing an electroplating process, so that errors of a router machine during a build-up process and errors occurred in a subsequent fabrication process as in the prior-art can be prevented to eliminate a drawback of an ineffective alignment of a build-up circuit to an electrode pad on a chip.

A further objective of the present invention is to provide a method for fabricating a chip embedded package structure which effectively positions a semiconductor chip in a carrier board by performing an electroplating process, so that the alignment precision of the semiconductor chip on the circuit board can be initially examined. Thus, reducing an unknown problem of the product, increasing the yield, and decreasing the product cost can be achieved.

In accordance with the foregoing and other objectives, the present invention proposes a method for fabricating a chip embedded package structure, comprising steps of: providing a carrier board with a first surface and a second surface, wherein the carrier board has at least one cavity formed therein; forming an adhesive layer on the second surface of the carrier board to seal one end of the cavity of the carrier board; mounting at least one semiconductor chip to the adhesive layer and receiving the semiconductor chip in the cavity of the carrier board to form a gap between the cavity of the carrier board and the semiconductor chip, wherein the semiconductor chip has an active surface, and a corresponding non-active surface for mounting the semiconductor chip to the adhesive layer; forming a protection layer on the active surface of the semiconductor chip; forming a first conductive layer to cover the first surface of the carrier board, a surface of the protection layer, a surface of the adhesive layer at a position corresponding to the gap between the cavity of the carrier board and the semiconductor chip, and a surrounding surface of the gap; forming a first resist layer on the first conductive layer and defining an electroplating opening in the first resist layer at a position corresponding to the gap between the cavity of the carrier board and the semiconductor chip; and performing an electroplating process to form a first metal layer in the electroplating opening to a predetermined height, so as to position and fix the semiconductor chip in the cavity of the carrier board via the first metal layer. Finally, the first resist layer, the first conductive layer covered by the first resist layer, the adhesive layer, and the protection layer are then removed.

The present invention also proposes another preferable embodiment of a method for fabricating a chip embedded package structure. The method differs from the forgoing method in that, further comprising: removing the adhesive layer and forming a second conductive layer on the non-active surface of the semiconductor chip and the second surface of the carrier board; forming a second resist layer on the second conductive layer and defining an electroplating opening in the second resist layer at a position corresponding to the cavity of the carrier board; and performing an electroplating process to form a second metal layer in the electroplating opening of the second resist layer to a predetermined height, so that the second metal layer can be used to dissipate heat generated during operating the semiconductor chip. Finally, the first resist layer, the first conductive layer covered by the first resist layer, the second resist layer, the second conductive layer covered by the second resist layer, and the protection layer are then removed.

In accordance with the foregoing method, an embodiment of the chip embedded package structure of the present invention comprises: a carrier board with at least one cavity; at least a semiconductor chip received in the cavity of the carrier board to form a gap between the cavity of the carrier board and the semiconductor chip; a metal layer formed in the gap between the cavity of the carrier board and the semiconductor chip to a predetermined height, such that the semiconductor chip can be positioned and fixed in the cavity of the carrier board.

The present invention also proposes another preferable embodiment of the chip embedded package structure. The embodiment differs from the forgoing embodiment in that another metal layer of predetermined height is formed on the non-active surface of the semiconductor chip to serve as a heat sink of the chip.

Comparing to the conventional technology, the chip embedded package structure and fabrication method of the present invention primarily forms a metal layer in a gap between the semiconductor chip and the carrier board by electroplating process, such that semiconductor chip can be effectively fixed in the cavity of the carrier board. Therefore, an alignment precision of the semiconductor chip integrated with the carrier board can be controlled and examined before performing the subsequent fabrication process. As a result, the semiconductor chip structure is free of restriction by preventing existing errors and limitations of a router machine.

Moreover, the present invention effectively positions the semiconductor chip in the carrier board by electroplating process, thus, it is not limited by errors of a router machine and errors occurred in a subsequent fabrication process. Additionally, the semiconductor chip is effectively fixed in the carrier board before the build-up process, therefore, a problem such as build-up circuit can not be effectively aligned to the electrode pad of the semiconductor chip, resulted from the smaller dimension of the electrode pad of the semiconductor chip comparing to the precision of a router machine and the errors occurred in the subsequent fabrication process, can be prevented.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

The present invention is described in the following with specific embodiments, so that one skilled in the pertinent art can easily understand other advantages and effects of the present invention from the disclosure of the invention. The present invention may also be implemented and applied according to other embodiments, and the details may be modified based on different views and applications without departing from the spirit of the invention.

Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Referring to FIGS. 2A to 2F are cross-sectional views demonstrating a method for fabricating a chip embedded package structure according to the first embodiment of the present invention.

Figure 1:
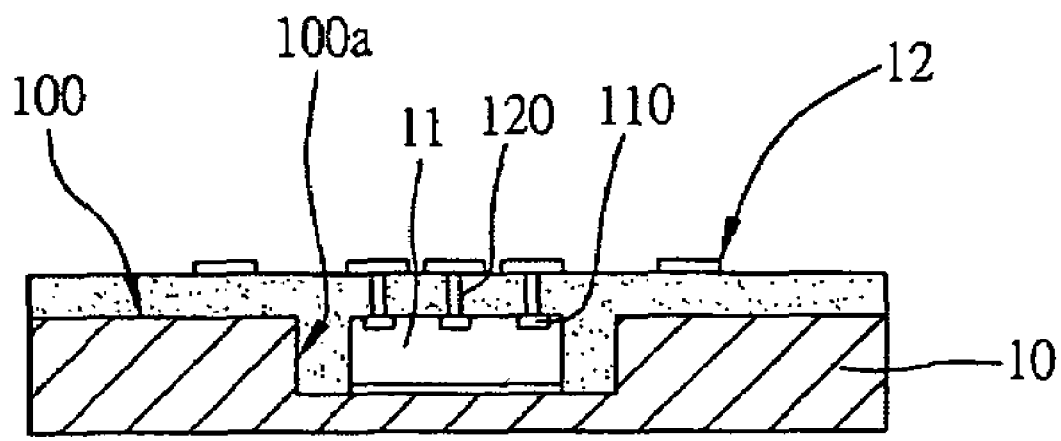
FIG. 1 is a cross-sectional view showing a conventional semiconductor chip embedded package structure.
Figure 2A:
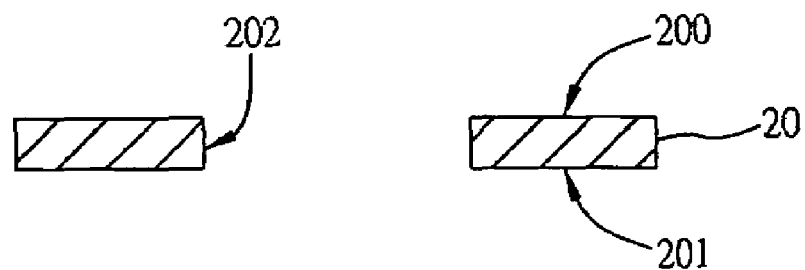
FIG. 2A to FIG. 2F are cross-sectional views showing a method for fabricating a chip embedded package structure according to the first embodiment of the present invention.

First of all, FIG. 2A demonstrates a carrier board 20 which has a first surface 200 and its opposite surface, a second surface 201 with a cavity 202 running through the first and second surfaces of the carrier board 20. The carrier board 20 can be a radiating board made by a metal material; moreover, the carrier board 20 can also be an insulating board made by BT resin, FR4 resin, epoxy resin, fiberglass resin, polyimide or melamine, and forming the circuit board with circuit structure.

Figure 2B:
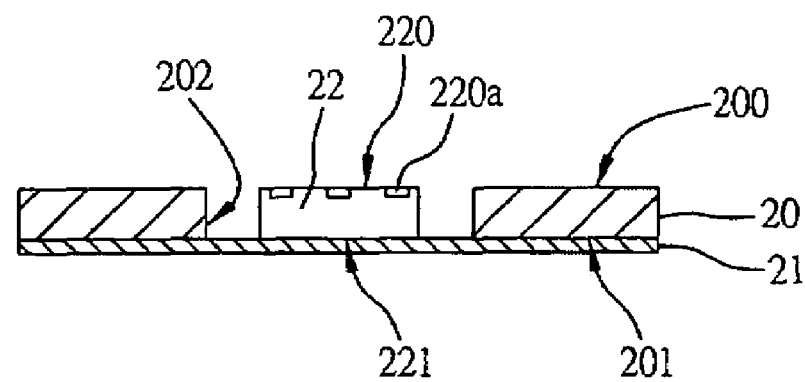

Referring to FIG. 2B, an adhesive layer 21 is formed on the top surface 201 of the carrier board 20 to seal the cavity 202 of the carrier board 20. Additionally, at least one semiconductor chip 22 is mounted on the adhesive layer 21 and is received in the cavity 202 of the carrier board 20, thus, the semiconductor chip 22 is fixed within the cavity 202. Moreover, the semiconductor chip 22 has an active surface 220 with a plurality of electrode pads 220a and a non-active surface 221, such that non-active surface 221 of the semiconductor chip 22 is mounted on the adhesive layer 21 and is received in the cavity 202 of the carrier board 20.

Figure 2C:
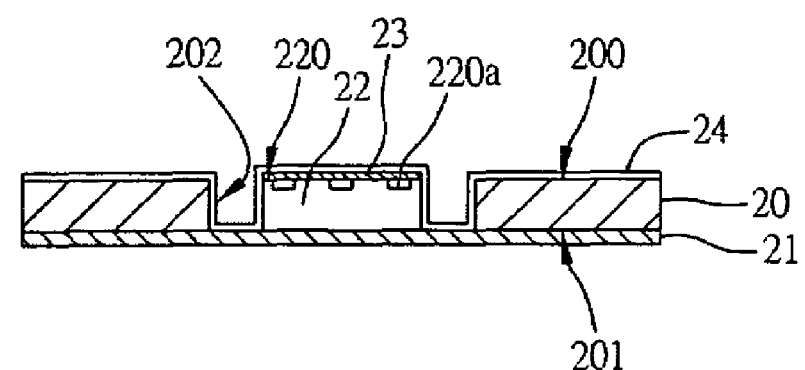

FIG. 2C shows a protection layer 23 is formed on the active surface 220 of the semiconductor chip 22, so as to protect the electrode pad 220a on the active surface 220 of the semiconductor chip 22. A conductive layer 24 then is formed on the first surface 200 of the carrier board 20, the surface of the protection layer 23, the surface of the adhesive layer 21 of the cavity 202 and surfaces around the cavity 202. Moreover, the conductive layer 24 is primarily a current conductive path for the subsequent electroplating which can be constructed by metal, alloy or deposit of metal layers, such as a compound from copper, tin, nickel, chromium, titanium, copper chromium or tin lead. Alternatively, a conductive polymer such as polyacetylene, polyaniline, or organosulfide polymer can be used as the conductive layer 24.

Figure 2D:
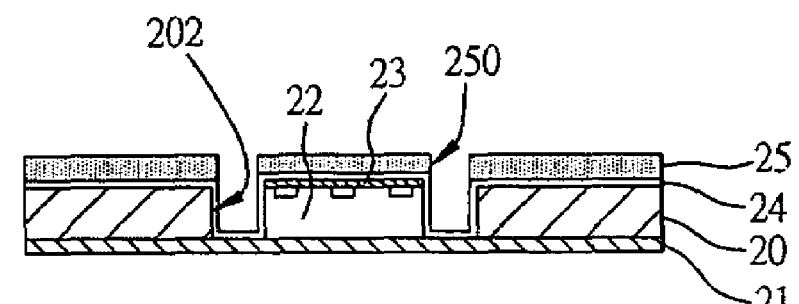

Referring to FIG. 2D, a resist layer 25 is formed on the conductive layer 24 to perform a patterning process, so as to form a cavity 250 on the resist layer 25, therefore, part of the conductive layer 24 is exposed. The resist layer 25 can be a dry film or a liquid photoresist, which is formed on the surface of the conductive layer 24 via printing, spin coating and mounting. An electroplating opening 250 is then formed by patterning which utilizes exposure and development etc, such that the cavity 250 is exposed in a gap between the cavity 202 of the carrier board 20 and the semiconductor chip 22.

Figure 2E:
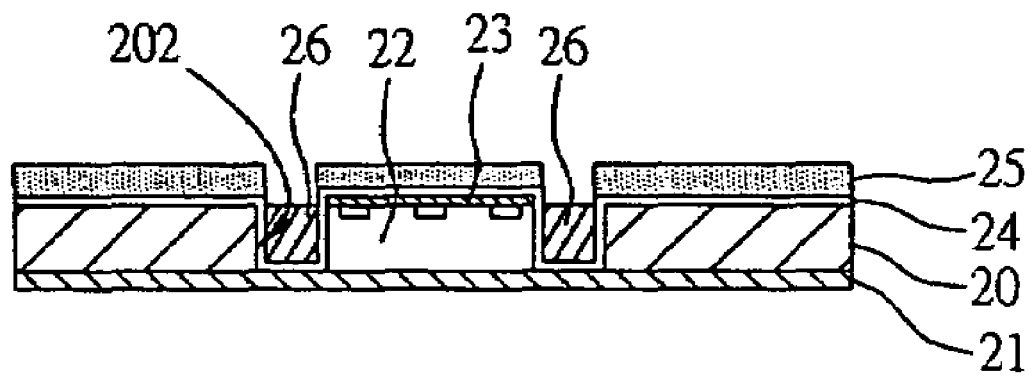

Moreover, referring to FIG. 2E which demonstrates an electroplating process of the carrier board 20, so as a result that a first metal layer 26 is formed in the electroplating opening by utilizing the conductive property of the conductive layer 24 as a conductive current path during the electroplating process. The metal layer 26 can be one of the materials described in the following: lead, tin, silver, copper, gold, bismuth, antimony, zinc, nickel, zirconium, magnesium, indium, tellurium, and gallium. In addition, copper is more stable material for electroplating and cost less, so electro-copper is a better material to form the metal layer 26. The semiconductor chip 22 is effectively fixed in the carrier board 20 because that metal layer 26 is formed in a gap between the cavity 202 of the carrier board 20 and the semiconductor chip 22. Furthermore, the height of the metal layer 26 is not limited by FIG. 2E. and can be adjusted according to the needs.

Figure 2F:
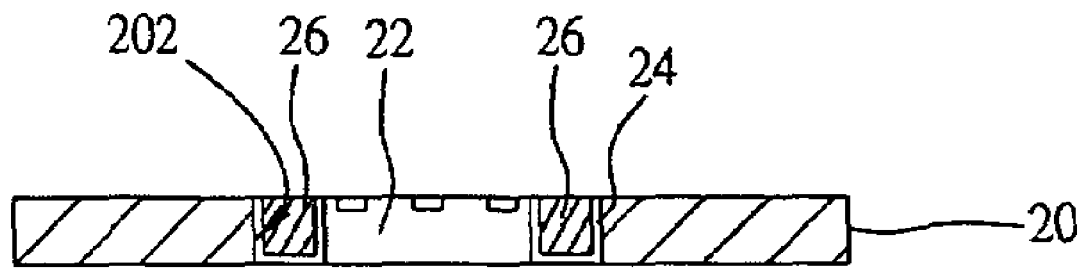

Referring to FIG. 2F, the adhesive layer 21, the resist layer 25, the conductive layer 24 underneath and the protection layer 23 can be removed to effectively fixed the semiconductor chip 22 integrated with the carrier board 20, such that a subsequent process can be performed (e.g. circuit build-up process) to complete the package and the outer current connection of the semiconductor chip.

The semiconductor chip 22 can be accurately fixed in the carrier board 20 because of the metal layer 26 can fill in the gap between the cavity 202 of the carrier board 20 and the semiconductor chip 22, therefore, effectively performing a subsequent process such as a build-up process.

Accordingly, in the present invention, the chip embedded package structure fabrication method comprises of: the carrier board 20, at least one semiconductor chip 22, the conductive layer 24, and the metal layer with destined height 26. In addition, the carrier board 20 has the first surface 200, the second surface 201 and the cavity 202 running through the first and the second surface of the carrier board 20; the semiconductor chip 22 mounted in the cavity 202; the conductive layer 24 formed in the cavity 202 of the carrier board and surrounding surface of the cavity 202; the metal layer 26 formed on the conductive layer 24 and filled in the gap between the cavity 202 of the carrier board 20 and the semiconductor chip 22 to effectively fixed the semiconductor chip 22 on the carrier board 20, so as to perform the subsequent process such as a circuit build-up process.

Referring to FIGS. 3A to 3I are cross-sectional views demonstrating a method for fabricating a chip embedded package structure according to the second embodiment of the present invention.

Figure 3A:
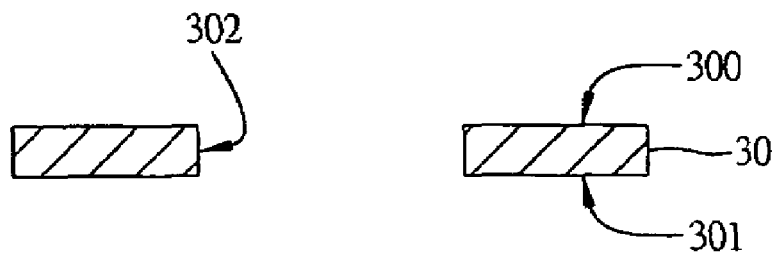
FIG. 3A to FIG. 3I are cross-sectional views showing a method for fabrication a chip embedded package structure according to the second embodiment of the present invention.

First of all, FIG. 3A demonstrates a carrier board 30 which has a first surface 300 and its opposite surface, a second surface 301 with a cavity 302 running through the first and second surfaces of the carrier board 30. Moreover, the carrier board 30 can be metal made radiating or insulating board and forming the circuit board with circuit structure.

Figure 3B:
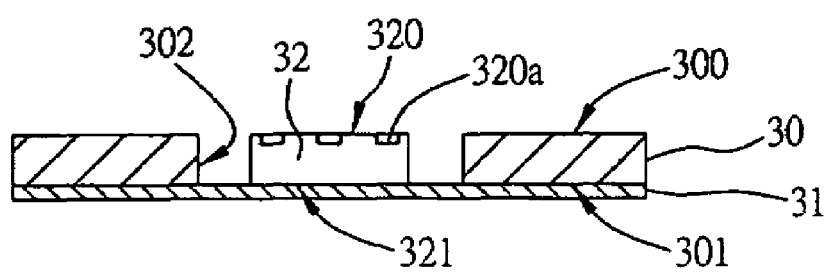

Referring to FIG. 3B, an adhesive layer 31 is formed on the top surface 301 of the carrier board 30 to seal the cavity 302 of the carrier board 30. Additionally, at least one semiconductor chip 32 is mounted on the adhesive layer 31 and is received in the cavity 302 of the carrier board 30, thus, the semiconductor chip 32 is fixed within the cavity 302. Moreover, the semiconductor chip 32 has an active surface 320 with a plurality of electrode pads 320a and a non-active surface 321, such that non-active surface 321 of the semiconductor chip 32 is mounted on the adhesive layer 31 and is received in the cavity 302 of the carrier board 30.

Figure 3C:
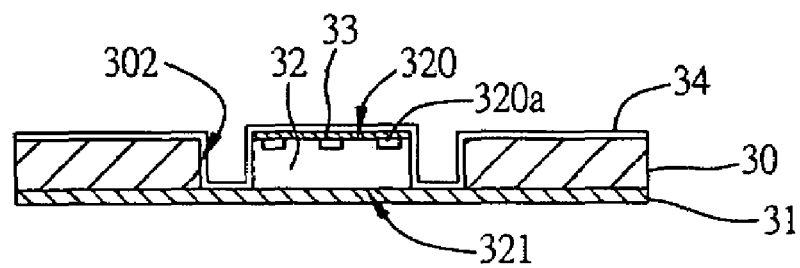

FIG. 3C shows a protection layer 33 is formed on the active surface 320 of the semiconductor chip 32, so as to protect the electrode pad 320a on the active surface 320 of the semiconductor chip 32. A conductive layer 34 then is formed on the first surface 300 of the carrier board 30, the surface of the protection layer 33, the surface of the adhesive layer 31 of the cavity 302 and surfaces around the cavity 302. Moreover, the conductive layer 34 is primarily a current conductive path for the subsequent electroplating which can be constructed by metal, alloy or deposit of metal layers and a conductive polymer.

Figure 3D:
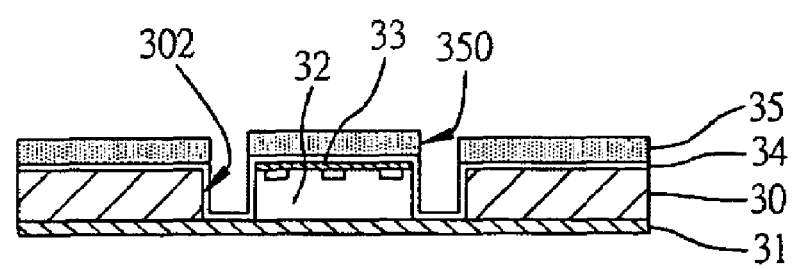

Referring to FIG. 3D, a resist layer 35 is formed on the conductive layer 34, and an electroplating opening 350 is formed in the resist layer 35. Moreover, a gap corresponding to the cavity 302 of the carrier board 30 and the semiconductor chip 32 the electroplating opening 350, is formed.

Figure 3E:
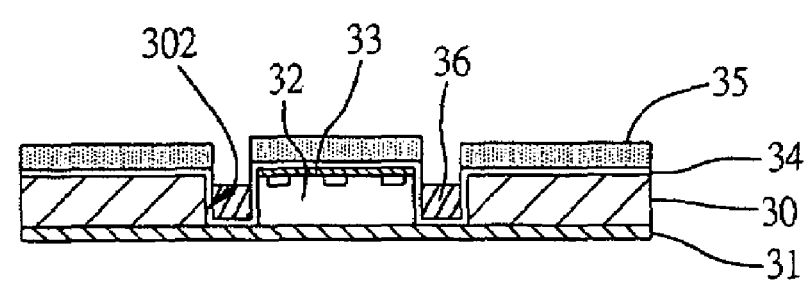

Moreover, referring to FIG. 3E which demonstrates an electroplating process of the carrier board 30, so as a result that a first metal layer 36 is formed in the electroplating opening by utilizing the conductive property of the conductive layer 34 as a conductive current path during the electroplating process. In addition, electro-cooper is a better material comprises the metal layer 36. The semiconductor chip 32 is effectively fixed in the carrier board 30 because that metal layer 36 is formed in a gap between the cavity 302 of the carrier board 30 and the semiconductor chip 32. Furthermore, the height of the metal layer 36 is not limited by FIG. 3E. and can be adjusted according to the needs.

Figure 3F:
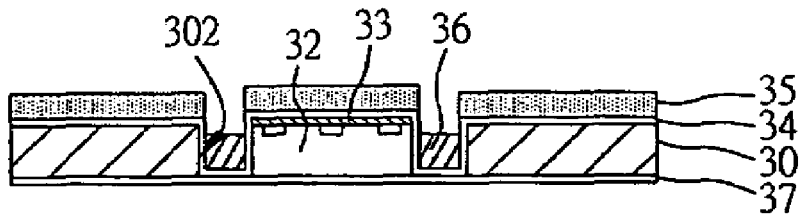

Referring to FIG. 3F, the adhesive layer 31 is removed and a second conductive layer 37 is formed on the second surface 301 of the carrier board 30 and on the non-active surface 321 of the semiconductor chip 32. Additionally, the conductive layer 37 is primarily a conductive current path required by metal material for the subsequent electroplating, such that conductive layer can be comprised by metal, alloy and deposit of metal layer or becomes a conductive polymer.

Figure 3G:
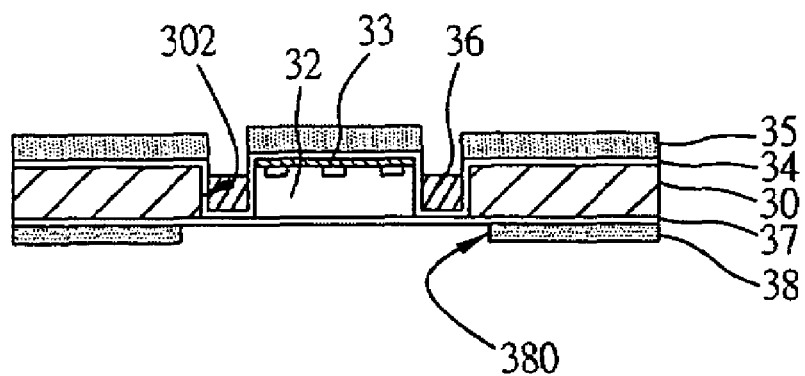

FIG. 3G demonstrates a resist layer 38 formed on the conductive layer 37, and patterning process is performed, as so to form an electroplating opening 380 of the resist layer 38, where the electroplating opening is formed in the corresponding cavity 302 of the electroplating opening 380.

Figure 3H:
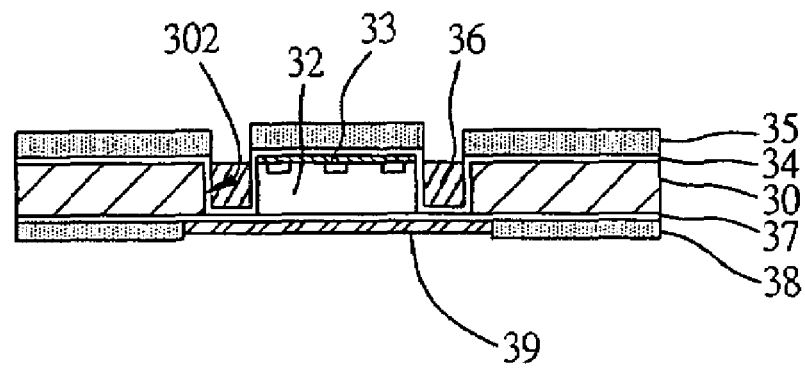

FIG. 3H demonstrates the electroplating process on the carrier board 30, so as a result that a second metal layer 39 is formed in the electroplating opening 380 by utilizing the conductive property of the conductive layer 37 as a conductive current path during the electroplating process. In addition, the surface area of the second metal layer 39 can be larger or smaller than the surface area of the semiconductor chip (is not shown in FIGs.), however, the larger surface area of the metal layer is found to be better. Moreover, the metal layer 36 corresponding to the cavity 302 of the carrier board can be continuously generated. A resist layer can be used to cover the metal layer 36 to prevent its continuous generation if the metal layer 36 reaches a defined height before electroplating. The metal layer 39 can be one of the materials described in the following: lead, tin, silver, copper, gold, bismuth, antimony, zinc, nickel, zirconium, magnesium, indium, tellurium, and gallium. Furthermore, copper is more stable material for electroplating and cost less, so electro-copper is a better material to form the metal layer 39.

Figure 3I:
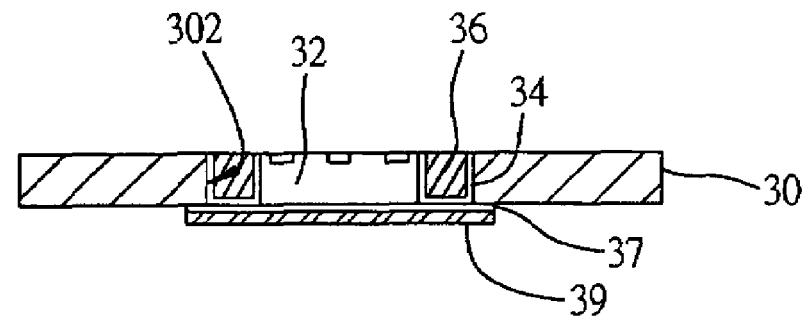

Finally, FIG. 3I demonstrates the removal of the resist layer 35 and its underneath conductive layer 34, the resist layer 38 and its above conductive layer 37, and the protection layer 33 on the active surface of the semiconductor chip 32, so as the carrier board 30 with semiconductor chip 32 is provided for the subsequent process, for example, build up process. Therefore, the package and the outer current connection of the semiconductor chip are completed.

As the result of the present invention, the metal layer with defined height 36 is formed in the gap between the cavity 302 of the carrier board 30 and the semiconductor chip 32, therefore, the semiconductor chip 32 can be accurately fixed in the carrier board 30 and the subsequent process of build-up can be performed.

Accordingly, in the present invention, the chip embedded package structure fabrication method comprises of: the carrier board 30, at least one semiconductor chip 32, the conductive layer 34, the first metal layer with destined height 36, the conductive layer 37 and the second metal layer with destined height 39. First of all, the carrier board 30 has the first surface 300, the second surface 301 and the cavity 302 running through the first and the second surface of the carrier board 30; the semiconductor chip 32 with the active surface 320 and its corresponding non-active surface 321, mounted in the cavity 302, such that a plurality of electrode pads 320a is formed on the active surface 320 of the semiconductor chip 32; the conductive layer 34 formed in the cavity 302 of the carrier board and the surrounding surfaces of the cavity 302; the metal layer 36 formed on the conductive layer 34 to fill in the gap between the cavity 302 of the carrier board 30 and the semiconductor chip 32, and so as to effectively fix the semiconductor chip 32 on the carrier board 30 to perform the subsequent process of circuit build-up; additionally, the conductive layer 37 formed on the non-active surface 321 of the semiconductor chip 32; moreover, the second metal layer 39 formed above the conductive layer 37, whereas the surface area of the second metal layer 39 can be larger or smaller than the surface are of semiconductor chip (is not shown in FIGs.) However, the larger surface area of the metal layer is found to be better.

Compared to the prior-art technology, the chip embedded package structure and fabrication of the present invention primarily forms a metal layer in a gap between the semiconductor chip and the carrier board by electroplating process, such that semiconductor chip can be effectively fixed in the cavity of the carrier board. Therefore, an alignment precision of the semiconductor chip integrated with the carrier board can be controlled and examined before performing the subsequent fabrication process. As a result, the semiconductor chip structure is free of restriction by preventing existing errors and limitations of a router machine.

Moreover, the chip embedded package structure and fabrication of the present invention effectively positions the semiconductor chip in the carrier board by electroplating process, thus, it is not limited by errors of a router machine and errors occurred a subsequent fabrication process. Additionally, the semiconductor chip is effectively fixed in the carrier board before the build-up process, therefore, a problem such as build-up circuit can not be effectively aligned to the electrode pad of the semiconductor caused by errors from a smaller electrode pad of semiconductor chip and errors occurred in the subsequent fabrication, is prevented.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A chip embedded package structure, comprising:
    a carrier board with a first surface and a second surface, wherein the carrier board has at least one cavity formed therein;
    at least one semiconductor chip received in the cavity of the carrier board to form a gap between the cavity of the carrier board and the semiconductor chip; and
    a metal layer formed in the gap between the cavity of the carrier board and the semiconductor chip; and
    a conductive layer formed on a surface of the cavity of the carrier board and a surrounding surface of the gap between the cavity of the carrier board and the semiconductor chip, wherein the metal layer is formed on the conductive layer.

2. The chip embedded package structure of claim 1, wherein the carrier board is at least one of a metal board, an insulating board, and a circuit board formed with circuit structure.

3. The chip embedded package structure of claim 1, wherein the active surface of the semiconductor chip has a plurality of electrode pads.

4. A chip embedded package structure, comprising:
    a carrier board with a first surface and a second surface, wherein the carrier board has at least one cavity formed therein;
    at least one semiconductor chip mounted in the cavity of the carrier board to form a gap between the cavity of the carrier board and the semiconductor chip;
    a first metal layer formed in the gap between the cavity of the carrier board and the semiconductor chip; and
    a second metal layer formed on non-active surface of the semiconductor chip; and
    a first conductive layer formed on a surface of the cavity of the carrier board and a surrounding surface of the gap between the cavity of the carrier board and the semiconductor chip, wherein the first metal layer is formed on the first conductive layer.

5. The chip embedded package structure of claim 4, further comprising: a second conductive layer formed between the second metal layer and the semiconductor chip.

6. The chip embedded package structure of claim 4, wherein the carrier board is at least one of a metal board, an insulating board, and a circuit board formed with circuit structure.

7. The chip embedded package structure of claim 4, wherein surface area of the second metal layer is larger than surface area of the semiconductor chip.

8. The chip embedded package structure of claim 4, wherein surface area of the second metal layer is smaller than surface area of the semiconductor chip.

* * * * *